(12) United States Patent
Scott et al.

(10) Patent No.: US 7,811,876 B2
(45) Date of Patent: Oct. 12, 2010

(54) REDUCTION OF MEMORY INSTABILITY BY LOCAL ADAPTATION OF RE-CRYSTALLIZATION CONDITIONS IN A CACHE AREA OF A SEMICONDUCTOR DEVICE

(75) Inventors: Casey Scott, Dresden (DE); Anthony Mowry, Buda, TX (US); Frank Wirbeleit, Dresden (DE)

(73) Assignee: GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 12/188,324

(22) Filed: Aug. 8, 2008

(65) Prior Publication Data
US 2009/0221115 A1    Sep. 3, 2009

(30) Foreign Application Priority Data
Feb. 29, 2008    (DE) .................. 10 2008 011 931

(51) Int. Cl.
*H01L 21/8238* (2006.01)
(52) U.S. Cl. ................ 438/199; 438/305; 257/E21.632
(58) Field of Classification Search ......... 438/197–199, 438/305; 257/69, 204, 288, E21.632, E27.108
See application file for complete search history.

(56) References Cited

U.S. PATENT DOCUMENTS

| | | | |
|---|---|---|---|
| 6,146,934 A * | 11/2000 | Gardner et al. ............... 438/230 |
| 6,436,747 B1 | 8/2002 | Segawa et al. ............... 438/197 |
| 6,953,728 B2 * | 10/2005 | Murakami et al. ........... 438/275 |
| 7,060,549 B1 * | 6/2006 | Craig et al. .................. 438/199 |
| 7,470,618 B2 * | 12/2008 | Sayama et al. ............... 438/663 |
| 2005/0020022 A1 * | 1/2005 | Grudowski ................... 438/305 |
| 2005/0118765 A1 | 6/2005 | Taniguchi et al. ........... 438/275 |
| 2005/0214998 A1 | 9/2005 | Chen et al. ................... 438/199 |
| 2005/0218455 A1 | 10/2005 | Maeda et al. ................ 257/368 |
| 2006/0154429 A1 * | 7/2006 | de Souza et al. ............. 438/305 |
| 2007/0010073 A1 * | 1/2007 | Chen et al. ................... 438/486 |
| 2007/0254444 A1 | 11/2007 | Bloomquist et al. ......... 438/305 |
| 2008/0124858 A1 * | 5/2008 | Nguyen et al. ............... 438/217 |
| 2008/0303090 A1 * | 12/2008 | Ieong et al. .................. 257/351 |

FOREIGN PATENT DOCUMENTS

| | | |
|---|---|---|
| DE | 102005057074 A1 | 5/2007 |
| JP | 02201922 A | 8/1990 |
| WO | WO 2007/126807 A1 | 11/2007 |
| WO | WO 2008/016505 A1 | 2/2008 |

OTHER PUBLICATIONS

Translation of Official Communication from German Patent Office for German Patent Application No. 10 2008 011 931.8 dated Dec. 9, 2008.

* cited by examiner

*Primary Examiner*—Khiem D Nguyen
(74) *Attorney, Agent, or Firm*—Williams, Morgan & Amerson, P.C.

(57) ABSTRACT

By appropriately locally controlling the conditions during a re-growth process in a memory region and a speed-critical device region, the creation of dislocation defects may be reduced in the memory region, thereby enhancing overall stability of respective memory cells. On the other hand, enhanced strain levels may be obtained in the speed-critical device region by performing an efficient amorphization process and re-crystallizing amorphized portions, for instance, in the presence of a rigid material to provide a desired high strain level.

19 Claims, 10 Drawing Sheets

REDUCTION OF MEMORY INSTABILITY BY LOCAL ADAPTATION OF RE-CRYSTALLIZATION CONDITIONS IN A CACHE AREA OF A SEMICONDUCTOR DEVICE

BACKGROUND

1. Field of the Disclosure

Generally, the present disclosure relates to the formation of integrated circuits, and, more particularly, to the formation of field effect transistors in complex circuits including a complex logic circuitry and a memory area, such as a cache memory of a CPU.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, CMOS technology is currently the most promising approach due to the superior characteristics in view of operating speed and/or power consumption. During the fabrication of complex integrated circuits using CMOS technology, millions of complementary transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The shrinkage of the transistor dimensions also raises a plurality of issues associated therewith that have to be addressed so as to not unduly offset the advantages obtained by steadily decreasing the channel length of MOS transistors. One major problem in this respect is the reduction of so-called short channel effects, which occur upon reducing the channel length. Generally, with a reduced channel length, the controllability of the channel becomes increasingly difficult and requires specific design measures, such as reduction of the thickness of the gate insulation layer, increased doping concentrations in the channel regions and the like. These countermeasures may, however, reduce the charge carrier mobility in the channel region. Accordingly, to further increase transistor performance, it has been proposed to increase the charge carrier mobility in the channel region for a given channel length.

In principle, at least two mechanisms may be used, in combination or separately, to increase the mobility of the charge carriers in the channel region. First, the dopant concentration within the channel region may be reduced, thereby reducing scattering events for the charge carriers and thus increasing the conductivity. However, reducing the dopant concentration in the channel region significantly affects the threshold voltage of the transistor device and may affect the channel controllability as previously explained, thereby making a reduction of the dopant concentration a less attractive approach unless other mechanisms are developed to adjust a desired threshold voltage. Second, the lattice structure in the channel region may be modified, for instance, by creating tensile or compressive strain therein, which results in a modified mobility for electrons and holes, respectively. For example, creating tensile strain in the channel region may increase the mobility of electrons, which, in turn, may directly translate into a corresponding increase in the conductivity for N-type transistors. On the other hand, compressive strain in the channel region may increase the mobility of holes, thereby providing the potential for enhancing the performance of P-type transistors.

Therefore, a technique is frequently used that enables the creation of desired stress conditions within the channel region of different transistor elements by individually modifying the stress characteristics of a contact etch stop layer that is formed after completion of the basic transistor structure in order to form contact openings to the gate and drain and source terminals in an interlayer dielectric material. The effective control of mechanical stress in the channel region, i.e., effective stress engineering, may be accomplished by individually adjusting the internal stress in the contact etch stop layer in order to position a contact etch stop layer having an internal compressive stress above a P-channel transistor while positioning a contact etch stop layer having an internal tensile strain above an N-channel transistor, thereby creating compressive and tensile strain, respectively, in the respective channel regions.

Other strain-inducing mechanisms may be available for different transistor types in order to selectively increase the charge carrier mobility. For example, strain may be generated in the channel regions by appropriately incorporating strain-inducing materials into the basic transistor structure, wherein the strain-inducing material may be positioned close to the channel region, which may thus result in high strain levels. One prominent approach in this respect is the incorporation of a semiconductor material having a different natural lattice constant compared to the base material, i.e., silicon. Frequently, a silicon/germanium mixture may be positioned in and/or near the channel region in a strained state or a relaxed state, depending on the overall strain engineering strategy, in order to create the desired type of the strain. For instance, a strained silicon/germanium alloy may be provided in the drain and source areas, thereby inducing a compressive strain in the adjacent channel region, which in turn results in increased drive current capability of P-channel transistors.

Moreover, enhanced junction engineering techniques may be used in advanced SOI transistors for enhancing the performance thereof by creating more abrupt junctions for reducing the junction capacitance, which may translate into increased switching speed. To this end, a so-called pre-amorphization step may be performed prior to the drain/source implantation in order to more precisely define the dopant concentration. The substantially amorphous silicon in the drain and source regions requires, however, a re-crystallization anneal, which results in dislocation defects in the body region of the SOI transistor and in the drain and source regions. In SOI architectures, the further reduced junction capacitance in combination with the per se unwanted dislocation defects may result in a significant performance gain, since the increased junction leakage caused by the dislocation defects may reduce floating body effects while the reduced junction capacitance contributes to increased switching speed. Thus, this enhanced junction engineering may be combined with the stress layer approach in an attempt to further increase device performance.

In still other approaches for enhancing the performance of sophisticated transistor devices, the substantially amorphized state of the drain and source areas may also be used for increasing the finally established strain level in the channel region by re-crystallizing the amorphized portions in the presence of a rigid layer formed above the transistor area, wherein the strain may be substantially maintained after removal of the rigid material layer. Without intending to restrict the present application to the following explanation, it is believed that forming a rigid material layer, such as silicon nitride, on a substantially amorphized region may cause a high tensile strain in the material upon re-crystallization during an anneal process, since the initial crystalline drain and source material may expand in volume during the amorphization, wherein the reduction of volume during the anneal process in the presence of the rigid material layer formed after the volume increase may be substantially suppressed. Hence, after removal of the rigid layer, the strained portion of the drain and source areas may interact with the surrounding crystalline material and create a tensile strain in the channel region. Hence, in addition to the above considerations of pre-amorphization techniques with respect to junction engineering, the pre-amorphization may also be highly advantageous for N-channel transistors, since the additional strain effect described above may further contribute to an enhanced N-channel transistor performance. On the other hand, the additional tensile strain may adversely affect performance of the P-channel transistors, for which, however, other very efficient strain-inducing mechanisms are available, so that, in many cases, the pre-amorphization may be restricted to N-channel transistors.

Although this technique is highly efficient in individually enhancing performance of individual N-channel transistors, an increased failure probability and/or reduced production yield may be observed in complex circuits comprising logic circuits and high density memory areas, such as static RAM (random access memory) cells, thereby rendering the above pre-amorphization approach for N-channel transistors less desirable for the formation of highly advanced integrated circuits.

The present disclosure is directed to various methods and devices that may avoid, or at least reduce, the effects of one or more of the problems identified above.

SUMMARY OF THE DISCLOSURE

The following presents a simplified summary of the disclosure in order to provide a basic understanding of some aspects disclosed herein. This summary is not an exhaustive overview, and it is not intended to identify key or critical elements of the invention or to delineate the scope of the invention. Its sole purpose is to present some concepts in a simplified form as a prelude to the more detailed description that is discussed later.

Generally, the present disclosure relates to a technique for forming transistor elements of enhanced performance in speed-critical device areas, such as logic blocks of complex semiconductor devices, wherein a high strain component in the channel region may provide the desired drive current capability and switching speed. For this purpose, in particular the performance of N-channel transistors may be enhanced by providing strain-inducing mechanisms in combination with enhanced PN junction profiles, which may be accomplished on the basis of amorphization processes, wherein, upon re-crystallizing the amorphized portions in the N-channel transistors, an increased overall strain component as well as a desired junction behavior may be obtained. As previously discussed, the re-crystallization of the amorphized portions may result in dislocation defects, which may be acceptable when enhancing the overall transistor performance, for instance for SOI devices, while respective dislocation defects in other device areas, such as memory areas of sophisticated central processing units, may result in significant instabilities of the memory cells, despite the moderately high strain components achieved by the amorphization process. Since it is believed that a strong relation between the amorphization process, and thus the degree of crystalline damage in portions of the drain and source regions of N-channel transistors and the resulting strain obtained upon re-crystallizing the drain and source regions and the observed instability of memory cells, may exist, the principles disclosed herein contemplate a local modification of the re-crystallization conditions in device areas, such as logic blocks and highly sensitive areas, such as static RAM regions. That is, the conditions for obtaining a high mechanical strain component in the N-channel transistors by using an amorphization process may be maintained in speed-critical logic blocks, thereby providing the possibility of even further enhancing the strain-inducing mechanisms without being restricted by increased yield loss due to instability of the memory cells, wherein also crystalline defects, such as dislocations, may be maintained, as may even be considered advantageous with respect to reducing floating body effects in SOI devices and the like. On the other hand, significantly different conditions for activating the drain and source regions of the N-channel transistors in memory areas may be created by locally reducing the probability of creating dislocation defects.

In some illustrative aspects disclosed herein, efficient stress memorization techniques may be used for N-channel transistors for achieving a high strain level in the speed-critical regions, while the amorphization process required for the stress memorization technique may be restricted to the speed-critical device areas, thereby providing significantly different conditions during a corresponding heat treatment, which may therefore result in less pronounced strain levels in the N-channel transistors of the memory cells, while additionally enhancing overall stability. Although the strain level may be reduced in the memory area, the overall device performance may not substantially negatively be affected, since typically the speed-critical device areas may represent the limiting factor for overall device performance. Since the strain-inducing mechanism, for instance the degree of lattice damage prior to a strained re-crystallization of the drain and source areas of the N-channel transistors in the logic block, may no longer be restricted by stability criteria for the memory area, an even further enhanced strain-inducing mechanism may be employed, thereby enabling a further increase of the overall performance substantially without causing a higher probability for yield losses due to operational instabilities in the memory regions.

In other illustrative aspects disclosed herein, the conditions during the re-crystallization of drain and source regions in N-channel transistors of memory areas may be modified in a local manner by providing a different shape of amorphized portions in the memory area compared to the N-channel transistors of the logic blocks so as to "shift" the position of any dislocation defects, which may thus result in enhanced operational stability of the memory cells. For this purpose, in some illustrative aspects, a tilted amorphization implantation step may be locally performed in the memory area, thereby enabling the positioning of the defects at a less critical area of the transistor.

In still other illustrative aspects disclosed herein, the crystallographic configuration of the semiconductor material may be appropriately selected to provide enhanced re-crystallization conditions, which may be accomplished by providing equivalent crystal plane for the vertical and horizontal growth directions during the re-crystallization process. Without intending to restrict the present disclosure to any theory or explanation, it is believed a significant reduction in crystalline defects may be achieved upon re-crystallizing a substantially amorphized portion when providing matching surface orientations of the horizontal and vertical growth directions.

One illustrative method disclosed herein comprises selectively performing a pre-amorphization process for drain and source regions of first N-channel transistors in a first device region, while masking first P-channel transistors in the first device region and also masking second P-channel transistors and second N-channel transistors formed in memory device regions of a semiconductor device. The method further comprises annealing the first and second P-channel transistors and N-channel transistors in the presence of a material layer formed above the first device region so as to re-crystallize the first N-channel transistors in a strained state. Additionally, the method comprises providing a strain-inducing mechanism in the first device region and the memory device region to induce strain in the first and second P-channel transistors and N-channel transistors.

A further illustrative method disclosed herein comprises performing a first amorphization process for first N-channel transistors of a first device region of a semiconductor device. The method additionally comprises performing a second amorphization process for second N-channel transistors of a memory device region, while masking the first device region, wherein the second amorphization process comprises an implantation step using a tilt angle for introducing an implantation species. Moreover, the first and second N-channel transistors are annealed and a stressed dielectric material is formed above the first and second N-channel transistors, wherein the stressed dielectric material induces a tensile strain in a channel region of the first and second N-channel transistors.

Still another illustrative method disclosed herein comprises forming first N-channel transistors in a first device region above a first initially crystalline semiconductor layer. The first N-channel transistors define a first length direction that is oriented along a predefined crystalline direction defined by a first set of Miller indices, wherein the predefined crystalline direction is substantially equivalent to a surface orientation of the first crystalline semiconductor layer, which is defined by a set of Miller indices that differs from the first set. The method further comprises forming second N-channel transistors in a memory device region above a second initially crystalline semiconductor layer, wherein the second N-channel transistors define a second length direction that is oriented along a predefined crystalline direction defined by a second set of Miller indices. The predefined crystalline direction is thereby substantially equivalent to a surface orientation of the second crystalline semiconductor layer, which is defined by the second set of Miller indices. Furthermore, the method comprises performing an amorphization implantation process for forming a substantially amorphized portion in drain and source areas of at least the first N-channel transistors and re-crystallizing the substantially amorphized portion of the first N-channel transistors.

BRIEF DESCRIPTION OF THE DRAWINGS

The disclosure may be understood by reference to the following description taken in conjunction with the accompanying drawings, in which like reference numerals identify like elements, and in which.

Figure 1A:
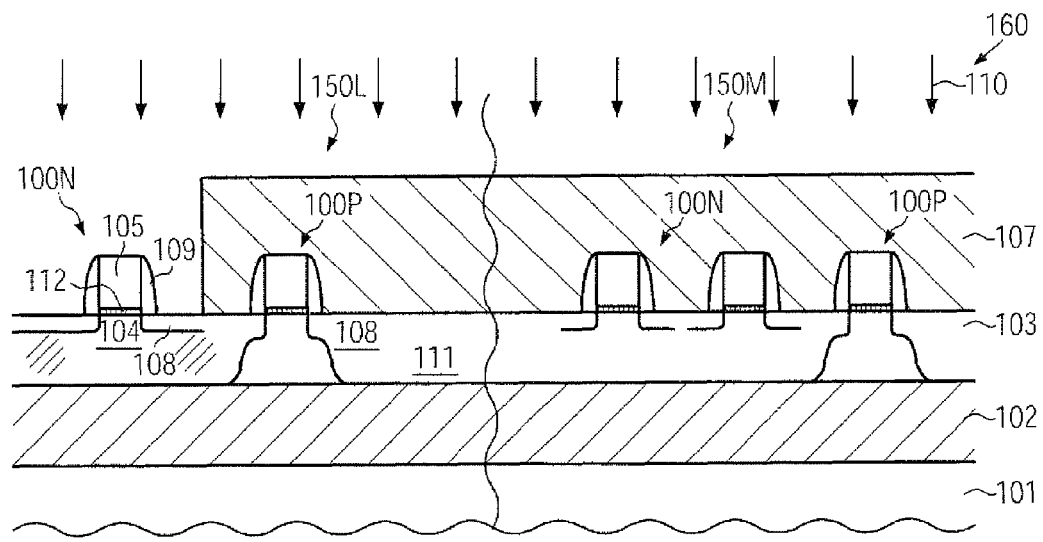
FIGS. 1a-1d schematically illustrate cross-sectional views of a semiconductor device including a speed-critical device region, such as a logic block, and a memory block during various manufacturing stages for forming strained N-channel transistors using a selective amorphization process, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure relates to a technique for enhancing performance of a highly complex semiconductor device including speed-critical device regions, such as logic blocks, of complex integrated semiconductor devices, such as CPU cores and the like, wherein, in illustrative embodiments, the transistors may be provided in a silicon-on-insulator (SOI) configuration. On the other hand, the complex semiconductor device may comprise a densely packed memory region, such as static RAM (random access memory) area, wherein the operational stability in this area may significantly depend on a complex mutual interaction between strain components and crystalline defects, such as dislocation defects. Thus, the present disclosure addresses the problem of a combination of strain-inducing mechanisms, as may be achieved by providing a highly stressed dielectric material above the transistor structures, possibly in combination with other strain-inducing mechanisms, wherein an amorphization of drain and source portions of N-channel transistors may further enhance the overall strain-inducing mechanism, for instance by applying stress memorization techniques, in which the drain and source area may be re-crystallized in the presence of a rigid material layer, such as a silicon nitride layer, thereby resulting in a strained state of the re-crystallized material, even if the rigid material layer may be partially or completely removed. Consequently, the technique of re-crystallizing the drain and source areas of N-channel transistors in the presence of a material layer may be advantageously combined with the provision of a highly stressed dielectric material after completing the basic transistor structure, thereby obtaining high strain levels, which may be desirable in the speed-critical device region, wherein, however, the conditions during the re-crystallization process may significantly affect production yield and stability of the memory cells.

Without intending to restrict the present application by the following explanation, it is believed that the increased sensitivity of memory cells is correlated with threshold variations, which may strongly depend on the drive current capability of the transistors in combination with the defect rate, in particular when SOI architectures are considered, wherein the corresponding transistor body may not be connected to a reference potential. Consequently, any variations of effectiveness and intensity of dislocation defects, which may in principle provide high junction leakage and thus a reduction of the floating body effects, may therefore significantly affect the operational behavior of circuit portions, in which a high degree of threshold voltage matching is required, such as memory cells. Consequently, in speed-critical signal paths, such as the CPU core, in which threshold voltage related dependencies are less critical, in which, however, high transistor performance is desirable, a high internal strain may be required, while also the respective crystalline defects may even be considered advantageous. On the other hand, in the static RAM areas, the intensity of an amorphization process, thereby also adjusting junction profile and finally obtained mechanical strain, may thus be reduced according to the principles disclosed herein without affecting the speed-critical device areas.

In still other illustrative embodiments disclosed herein, a modification of the pre-amorphization conditions may be accomplished by positioning the respective growth defects at less critical areas, that is, offset from the PN junctions, which may also result in a less pronounced dependence of the operational behavior of the memory cells on the internal strain level, which may thus be maintained at a moderately high value, even in the sensitive memory areas.

In other illustrative aspects disclosed herein, upon the re-crystallizing of substantially amorphized drain and source areas, a reduction of lattice defects may be accomplished by appropriately selecting the crystallographic configuration of the basic silicon material so that horizontal and vertical growth directions may have equivalent Miller indices.

FIG. 1a schematically illustrates a semiconductor device 160 comprising a first device region 150L, which may represent a region including logic circuitry requiring high internal strain levels, as previously explained. For example, the first device region 150L may represent a logic circuit block of a modern CPU (central processing unit), which may include a critical signal path and the like. The device 160 may further comprise a memory region 150M, which may have a high integration density, as is, for instance, the case for static RAM areas in complex semiconductor devices, such as CPUs, when the region 150M may represent a cache memory region. As previously explained, the memory region 150M may comprise transistor devices that are sensitive with respect to the internal strain level in combination with crystalline defects. Each of the device regions 150L, 150M may comprise a plurality of N-channel transistors and P-channel transistors 100N, 100P, wherein, in the embodiment shown, the transistors 100N, 100P may represent SOI transistors. It should be appreciated that, in one or both types of the transistors 100N, 100P, additional strain-inducing mechanisms may be incorporated, for instance, in the P-channel transistors 100P, a strained semiconductor compound may be provided to locally induce strain in the adjacent channel region.

The semiconductor device 160 further comprises a substrate 101 having formed thereon an insulating layer 102, such as a buried silicon dioxide layer, a silicon nitride layer and the like, followed by a crystalline semiconductor layer 103, which may represent a silicon-based layer, since most of the integrated circuits including complex logic circuits and extended memory areas are and will be in the foreseeable future produced on the basis of silicon. It should be appreciated, however, that the semiconductor layer 103 may comprise any other appropriate components as required by design rules. For instance, as previously indicated, silicon/germanium mixtures or silicon/carbon mixtures and the like may also be considered as silicon-based materials and may be used for adjusting the desired strain level and electronic characteristics in the transistors 100N, 100P. Furthermore, some or all of the N-channel transistors and P-channel transistors 100N, 100P may be separated from each other by isolation structures, which, for convenience, are not shown in FIG. 1a. The transistors 100N, 100P may further comprise a gate electrode structure 105, for instance comprised of polysilicon, which is separated from a corresponding channel region 104 by a gate insulation layer 112. The channel region 104 may represent a portion of a "body region," which in turn laterally separates appropriately doped source and drain regions 111 that may include extension regions 108. It should be appreciated that, in the manufacturing stage as shown in FIG. 1a, respective drain and source regions 111 may already be formed in the P-channel transistors 100P, depending on the overall process strategy, while extension regions 108 may be provided in the N-channel transistors 100N without the corresponding deep drain and source regions 111. Furthermore, sidewall spacers 109 may be formed on sidewalls of the gate electrodes 105 in order to provide the lateral profiling of the drain and source regions 111 and, in the illustrative embodiment shown in FIG. 1a, for the corresponding lateral offset of an amorphization implantation process 110.

The implantation process 110 may be designed to obtain a desired degree of amorphization in the N-channel transistor 100N of the first device region 150L such that enhanced overall device performance may be obtained for the N-channel transistor in the region 150L. That is, the amorphization process 110 may enhance a subsequent implantation process for forming deep drain and source regions and may also provide a desired amount of amorphization to create a desired high strain level upon re-crystallizing the drain and source areas in the presence of a rigid material to obtain a highly strained state of the drain and source regions, as previously explained. For this purpose, a heavy inert species, such as xenon and the like, or germanium, silicon and the like, may be used with appropriately selected dose and energy to create heavy lattice damage to substantially amorphize a corresponding area of the semiconductor layer 103. Hence, the process conditions may be specifically selected with respect to the performance criteria of the transistor 100N in the region 150L, without being restricted by the N-channel transistors 100N of the memory region 150M, since the region 150M, as well as the P-channel transistor 100P in the region 150L, may be masked by an appropriate implantation mask 107, such as a resist mask and the like.

The semiconductor device 100 as shown in FIG. 1a may be formed on the basis of well-established process techniques, wherein, however, contrary to conventional strategies, the implantation process 110 may be performed on the basis of appropriately selected process parameters in combination with the implantation mask 107 so as to reliably avoid an amorphization of the N-channel transistors in the memory region 150M. That is, after the provision of the substrate 101, which may have formed thereon the buried insulating layer 102 and the semiconductor layer 103, isolation structures may be formed by well-established lithography, etch, deposition and planarization techniques, when trench isolations are considered. Thereafter, the respective dopant concentration in the semiconductor areas for defining various transistor types may be formed on the basis of well-established implantation techniques, followed by providing an appropriate material for the gate insulation layers 112 and a subsequent deposition of gate electrode material. Based on respective advanced photolithography and etch techniques, these material layers may be patterned and the extension regions 108 may be formed on the basis of appropriate offset spaces (not shown), wherein other additional implantations, such as halo implantations and the like, may also be performed.

Next, the sidewall spacers 109 may be formed on the basis of well-established techniques involving the formation of a liner, if required, followed by the deposition of a spacer material, such as silicon nitride, silicon dioxide and the like, in combination with an appropriately designed anisotropic etch process. In the illustrative embodiment shown in FIG. 1a, the drain and source regions 111 of the P-channel transistors may be formed on the basis of appropriately designed implantation processes, while the N-channel transistors in the device regions 150L, 150M may be covered in accordance with well-established CMOS manufacturing techniques. It should be appreciated that an amorphization process may also have been performed for the P-channel transistor, as deemed appropriate. As previously explained, stress memorization techniques may be advantageous for N-channel transistors, while P-channel transistors may suffer from a reduced performance and hence a respective amorphization may be maintained at a low level and/or the drain and source regions 111 may have been annealed on the basis of appropriate techniques, such as laser-based techniques and the like, to provide a substantially crystalline state in the P-channel transistors 100P. Thereafter, the resist mask 107 may be formed by appropriately using a lithography mask for covering the region 150M and the P-channel transistor 100P in the device region 150L.

Figure 1B:
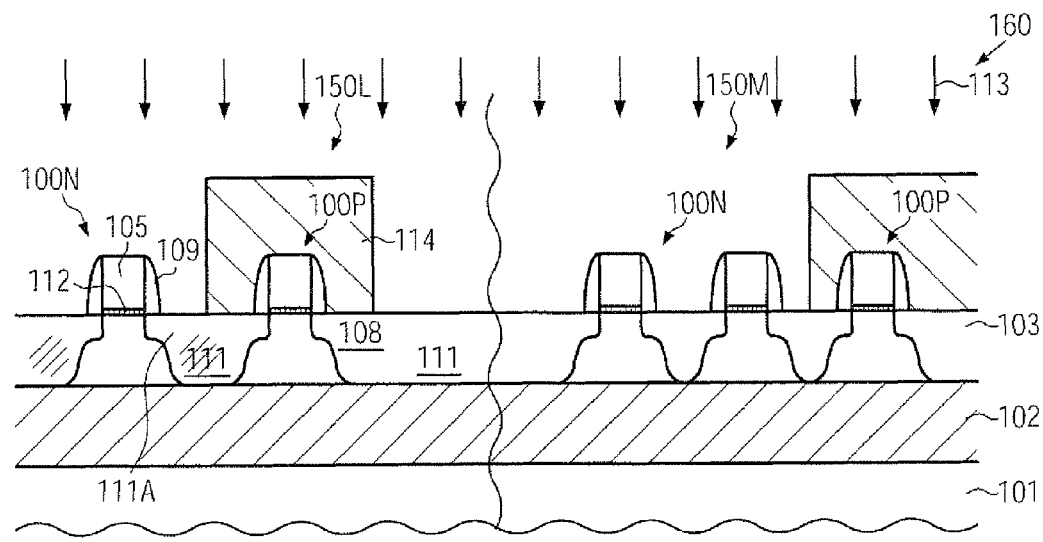

FIG. 1b schematically illustrates the semiconductor device 160 in a further advanced manufacturing stage, in which a further implantation mask 114 may be provided to cover the P-channel transistors 100P in both regions 150L, 150M. Furthermore, an implantation process 113 is performed designed to incorporate an appropriate dopant species for forming the drain and source regions 111 in the N-channel transistors 100N. Thus, in the device region 150L, the dopant species may be incorporated via the substantially amorphized portions 111 as previously formed by the implantation process 110, while in the memory region 150M, the dopant species may be incorporated into a substantially crystalline structure, thereby also causing lattice damage, however, at a significantly reduced intensity.

Figure 1C:
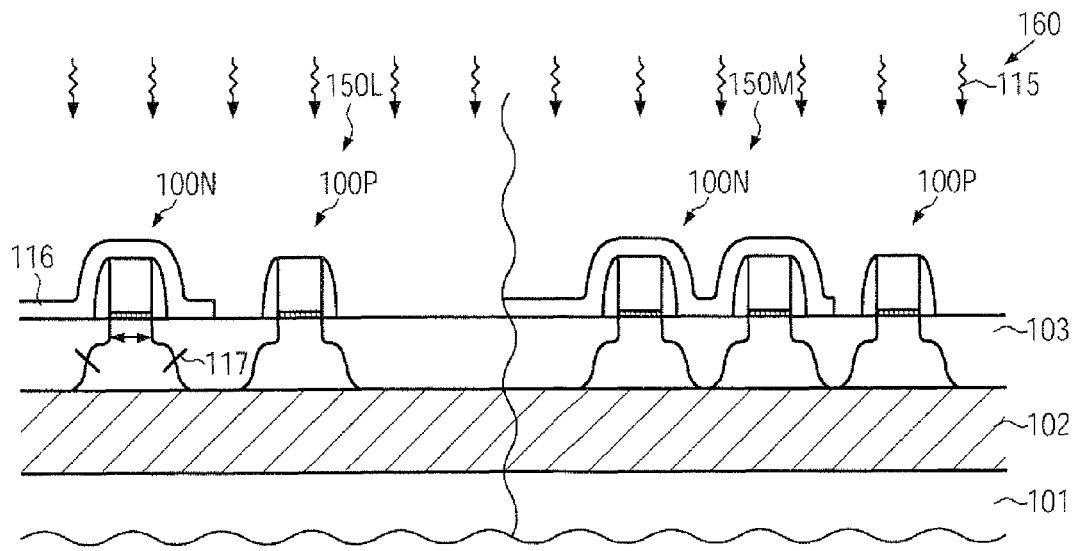

FIG. 1c schematically illustrates the semiconductor device 160 in a further advanced manufacturing stage. As illustrated, a rigid material 116, for instance in the form of silicon nitride material, possibly in combination with a thin etch stop liner (not shown), may be formed above the device region 150L and the memory region 150M, wherein, in some illustrative embodiments, the material 116 may cover both types of transistors 100N, 100P, if the P-channel transistors may have a substantially crystalline state so that annealing the device 160 by means of an appropriately designed anneal process 115 may not significantly alter the strain level in the P-channel transistors 100P. In other illustrative embodiments, as for instance shown in FIG. 1c, the rigid material layer 116 may be selectively provided above the N-channel transistors while the P-channel transistors may be exposed. In still other illustrative embodiments, the material layer 116 may be selectively provided above the transistor 100N of the region 150L, while the memory region 150M may be exposed. Consequently, during the anneal process 115, the portions 111A (FIG. 1b) may be re-crystallized in a highly strained state, while also creating respective defects 117, which may be referred to as dislocation defects, which may be acceptable in the N-channel transistor of the region 150L or which may even be advantageous, as previously explained. On the other hand, irrespective of whether the material layer 116 may be provided in the memory region 150M, the activation of dopants and the curing of implantation-induced damage may result in a significantly lower defect rate, in particular with respect to dislocation defects. On the other hand, the respective strain level in the N-channel transistors of the memory region 150M may be reduced, which, however, may not significantly affect the overall performance of the device 160, since typically the device region 150L substantially determines the overall operational behavior.

Figure 1D:
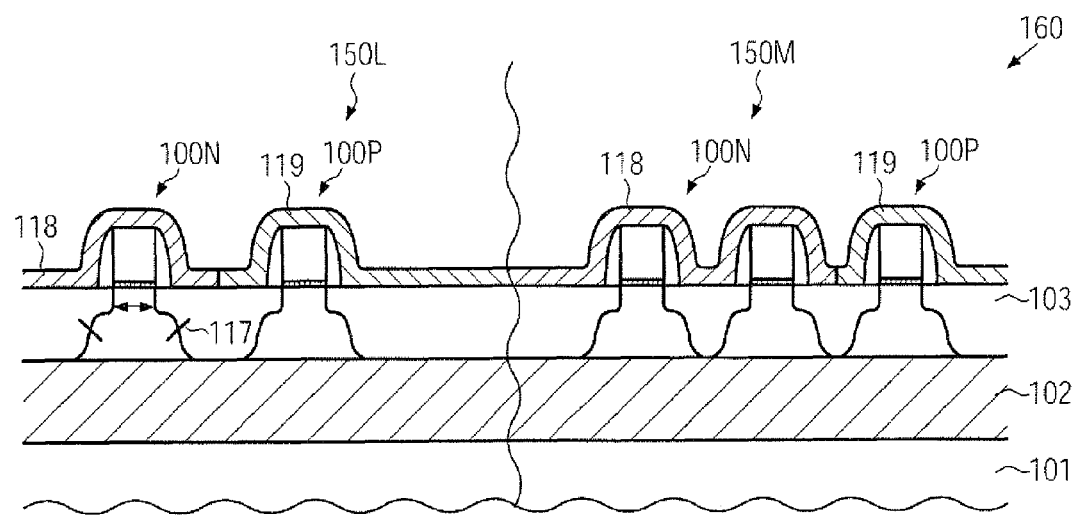

FIG. 1*d* schematically illustrates the semiconductor device 160 in a further advanced manufacturing stage. In the embodiment shown, an additional strain-inducing mechanism may be provided, wherein the N-channel transistors 100N in the device regions 150L, 150M may have formed thereabove a highly stressed dielectric material 118, for instance in the form of a silicon nitride material, generating a desired tensile strain in the channel regions of these transistor elements. Similarly, the P-channel transistors 100P in the regions 150L, 150M may have formed thereabove a highly compressively stressed dielectric material 119, such as silicon nitride, nitrogen-containing silicon carbide and the like. For example, silicon nitride material may be deposited with high internal stress levels on the basis of plasma enhanced chemical vapor deposition (PECVD) techniques, wherein, typically, compressive stress levels of approximately 2 GPa and even higher may be achieved, while a tensile stress level may be obtained in the range of 1 GPa and higher. Thus, the tensile-stressed dielectric material 118 may be provided with a desired high stress level, thereby enhancing performance of the N-channel transistors 100N in both regions 150L, 150M, while, additionally, in the region 150L, the previously performed amorphization process, in combination with the masked anneal process 115, may result in additional performance gain, as previously explained. On the other hand, a moderately high strain level may be obtained in the N-channel transistors 100N in the memory region 150M, wherein, however, enhanced operational stability may be achieved by omitting the amorphization process in the memory region 150M, as previously explained.

The dielectric materials 118, 119 may be formed in accordance with well-established process techniques, for instance by depositing one of the materials 118, 119 and selectively removing the same in non-desired device areas, followed by the deposition of the other one of the materials 118, 119, while also removing any unwanted portion thereof in a subsequent patterning process. Furthermore, respective etch stop and etch indicator materials may be provided in combination with the layers 118, 119 so as to enhance the overall patterning regime. Thereafter, a further dielectric material, such as silicon dioxide, may be deposited and contact openings may be formed in the dielectric materials in accordance with well-established process techniques.

Figure 1E:
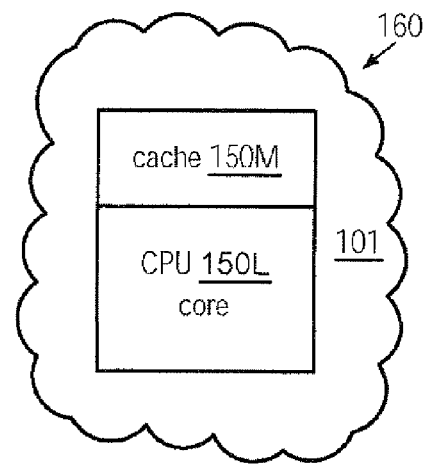
FIG. 1e schematically illustrates a top view of the device of FIGS. 1a-1d.

FIG. 1*e* schematically illustrates a top view of the semiconductor device 160 wherein the memory region 150M may be provided in the form of a cache area, while the region 150L may represent a CPU core including time-critical logic circuit blocks. Consequently, due to the avoidance of the amorphization process 110 (FIG. 1*a*) in the region 150M, a moderately low reduction of performance of the N-channel transistors may result, for the benefit of a significantly increased stability in the operational behavior, while, additionally, performance gain may be accomplished in the region 150L, thereby contributing to an overall gain in performance of the device 160.

With reference to FIGS. 1*f*-1*i*, further illustrative embodiments will now be described in which an amorphization process may be performed in the memory region 150M, however, on the basis of a tilted implantation step so as to provide a modified shape of the amorphized portion.

Figure 1F:
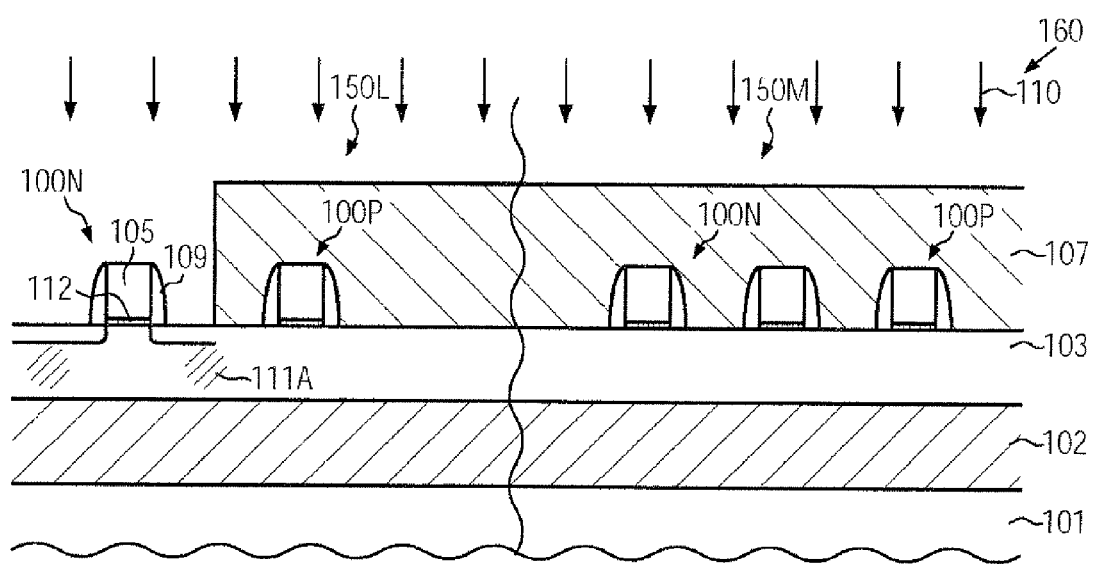
FIGS. 1f-1i schematically illustrate cross-sectional views of the semiconductor device including the memory region and the speed-critical device region according to still further illustrative embodiments, in which enhanced stability may be achieved in the memory region by a tilted amorphization process.

FIG. 1*f* schematically illustrates the semiconductor device 160 according to one illustrative embodiment in which the amorphization implantation process 110 may be performed on the basis of the resist mask 107, as previously explained with reference to FIG. 1*a*. Hence, the amorphized portions 111A are selectively formed in the N-channel transistor 100N of the region 150L. Thus, in the embodiment shown, the amorphization process 110 may be blocked in the entire memory region 150M. In still other illustrative embodiments, the implantation mask 107 may also expose the N-channel transistors 100N of the memory region 150M, thereby also creating respective amorphized portions 111A therein.

Figure 1G:
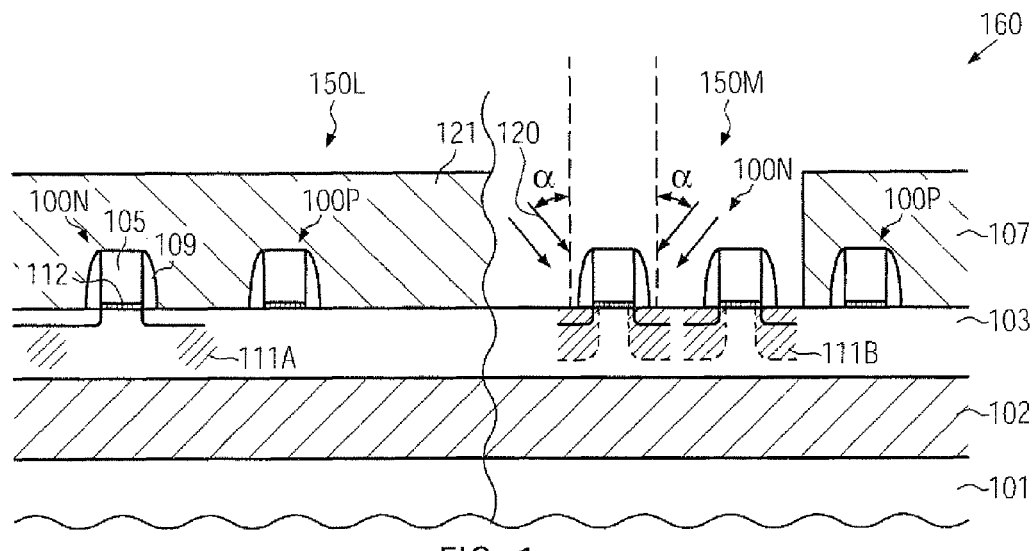

FIG. 1*g* schematically illustrates the device 160 during a further amorphization process 120 which may be performed on the basis of a further implantation mask 121, which may cover the device region 150L, while exposing the N-channel transistors 100N of the memory region 150M, while also covering the P-channel transistors therein. As indicated, the implantation process 120 may comprise at least one implantation step that is performed on the basis of a tilt angle $\alpha$, which is to be understood as the angle between the incident ion beam and the orthogonal direction with respect to the surface of the semiconductor layer 103. That is, a substantially parallel ion beam arriving at the layer 103 in a substantially perpendicular manner may be considered as a non-tilted implantation process. Thus, a tilt angle of $\alpha$ and $-\alpha$ may be used during the process 120, thereby placing the amorphizing species below the gate electrode 105 and hence "shifting" the interface between crystalline areas and amorphized areas toward the channel region. Thus, contrary to the substantially amorphized portions 111A in the device region 150L, the amorphized portions 111B may be modified so as to also shift respective crystalline defects away from the respective PN junction upon re-crystallizing the portions 111B.

Figure 1H:
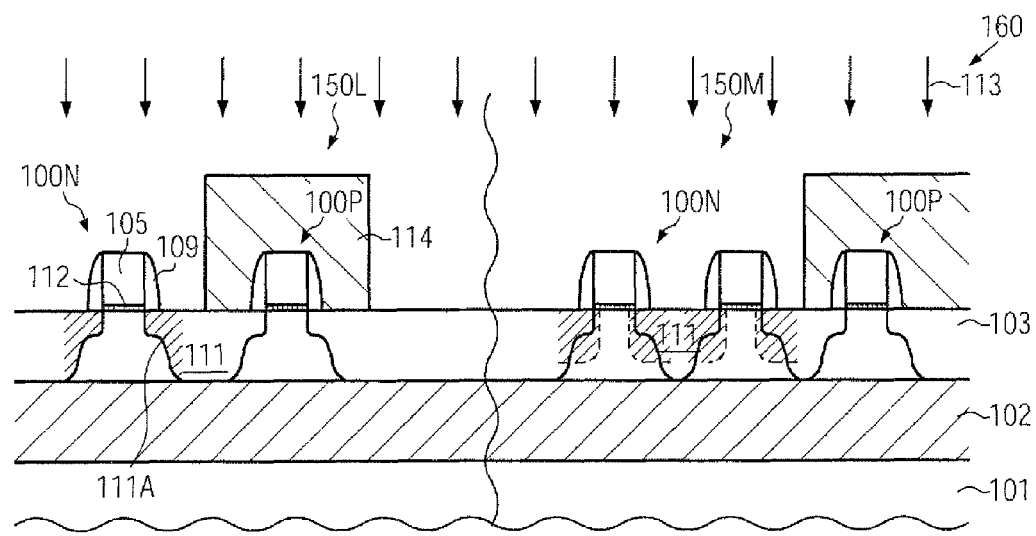

FIG. 1*h* schematically illustrates the device 160 during the implantation process 113 for incorporating the dopant species so as to define the drain and source regions 111, which may be, however, in a highly damaged state.

Figure 1I:
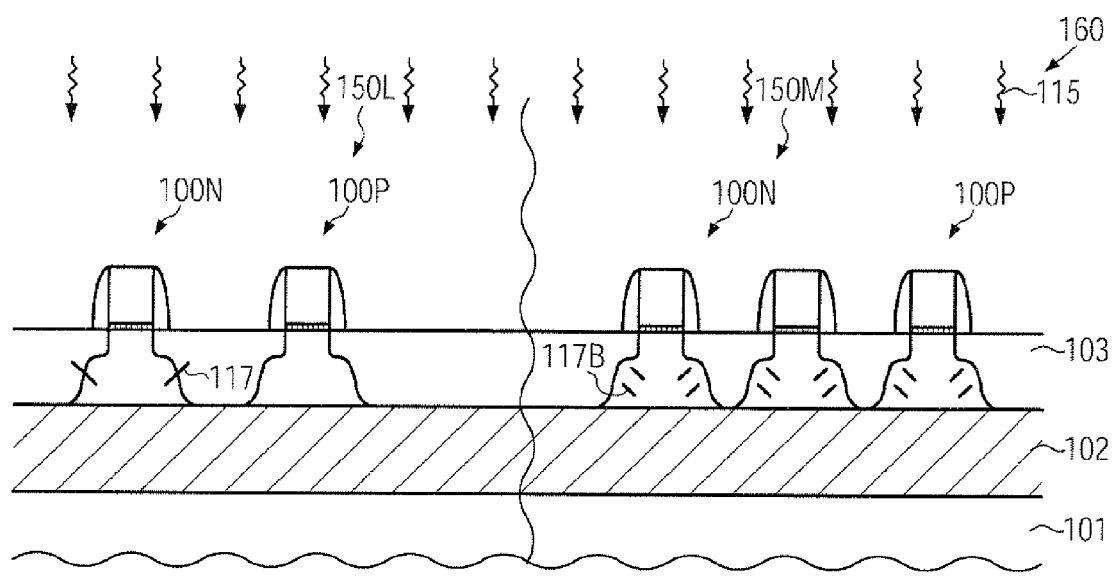

FIG. 1*i* schematically illustrates the device 160 during the annealing process 115 in order to crystallize the amorphized portions 111A, 111B. Furthermore, the drain and source regions of the P-channel transistors 100P may be activated and re-crystallized, depending on the overall device requirements. Consequently, during the anneal process 115, the defects 117 may be created, as previously explained, while, in the memory region 150M, the defects 117B may be positioned at less critical areas, i.e., the defects 117B may affect the PN junctions less efficiently compared to the region 150L, which may thus provide increased operational stability of the N-channel transistors 100N of the memory region 150M.

It should be appreciated that, in the embodiments shown, the anneal process 115 may be performed without a rigid material layer, if other efficient strain-inducing mechanisms may be provided. In other illustrative embodiments, the layer 116 (FIG. 1*c*) may be formed above the regions 150L, 150M, for example selectively for the respective N-channel transistors or for both the P-channel transistors and the N-channel transistors, so as to re-crystallize the amorphized portions 111A, 111 in a highly strained state. Also, in this case, enhanced operational stability for the N-channel transistors of the memory region 150M may be achieved, while the desired characteristics of the PN junctions in the device region 150L may be maintained. Thereafter, the further processing may be continued, as previously described.

With reference to FIGS. 2*a*-2*h*, further illustrative embodiments will now be described in which the crystallographic configuration of the semiconductor material may be appropriately selected in the sensitive device region in order to reduce the creation of dislocation defects.

Figure 2A:
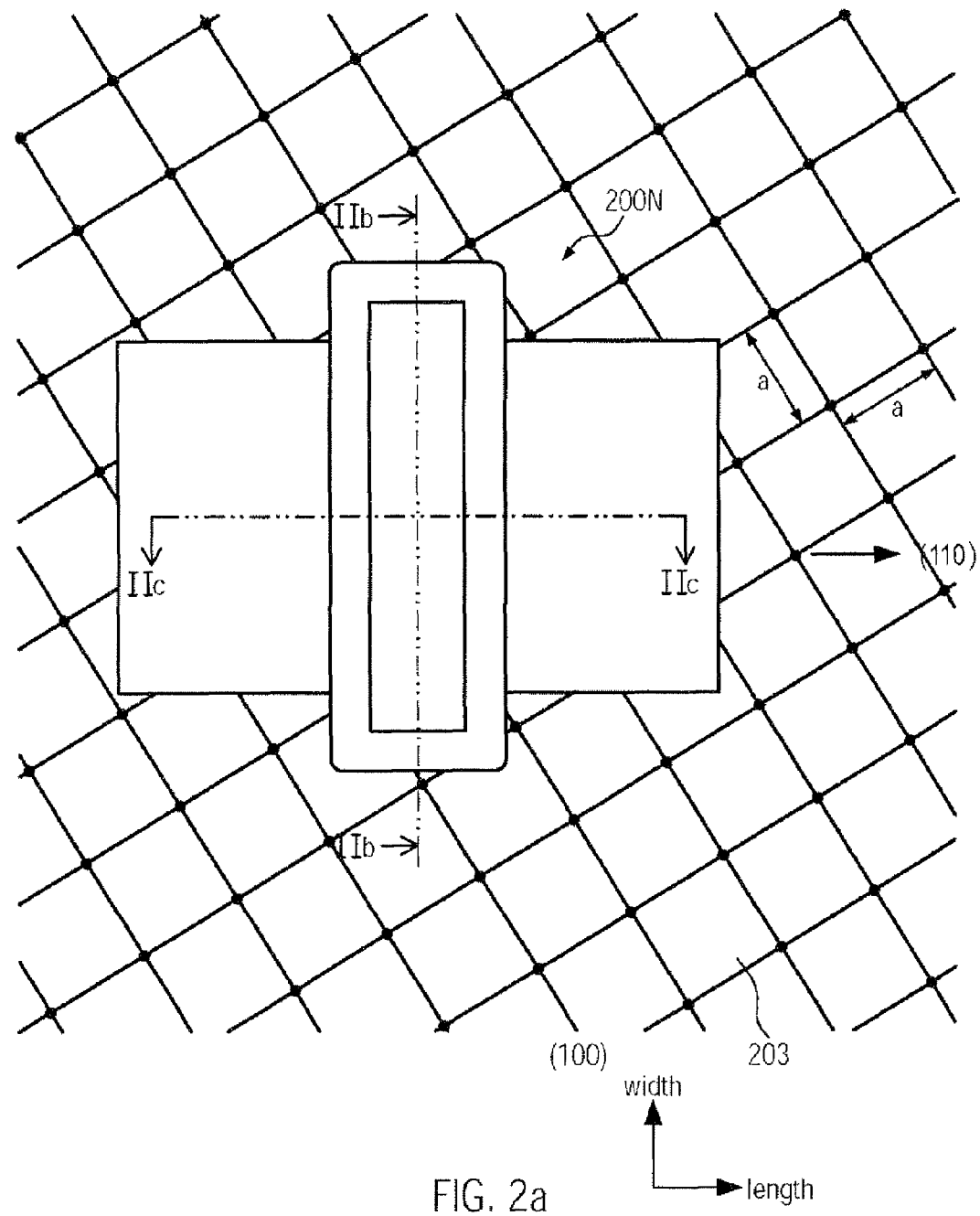
FIG. 2a schematically illustrates a top view of a transistor formed according to a standard crystallographic orientation.

FIG. 2a schematically illustrates a conventional transistor element 200N formed on a silicon-based layer 203. Typically the semiconductor layer 203 may be provided with a (100) surface orientation, wherein the transistor length direction, i.e., in FIG. 2a, the horizontal direction, is oriented along a (110) direction. In this respect, it should be appreciated that crystallographic orientations are typically expressed by so called Miller indices, which describe the position and orientation of a crystal plane by giving the coordinates of three non-collinear atoms lying in the plane. This may be conveniently expressed by the Miller indices, which are determined as follows.

First, the intercepts with three axes are to be determined in terms of the lattice constant of the semiconductor crystal under consideration.

Then, the reciprocals of these numbers are taken and are reduced to the smallest three integers having the same ratio, wherein the respective results are written in parentheses so as to indicate a specific crystalline plane. For convenience, planes equivalent by symmetry are herein denoted also by the same Miller indices. For instance, a (100), a (001) or a (010) plane are physically equivalent and may commonly be indicated as (100) plane.

Similarly, crystallographic directions may also be expressed on the basis of Miller indices, representing the set of the smallest integers having the same ratios as the components of a respective vector in the desired direction. For example, in crystals having a cubic lattice structure, such as a silicon crystal, a crystallographic direction classified by a certain set of Miller indices is perpendicular to a plane represented by the same set of Miller indices.

Thus, for the standard crystallographic orientation of the silicon layer 203, the surface thereof is a (100) surface, while the transistor length and the transistor width directions are aligned to <110> directions. Hence, for a crystalline material that has to be grown on the layer 203, a corresponding growth direction, i.e., a direction perpendicular to the drawing plane of FIG. 2a, is a <100> direction.

Figure 2B:
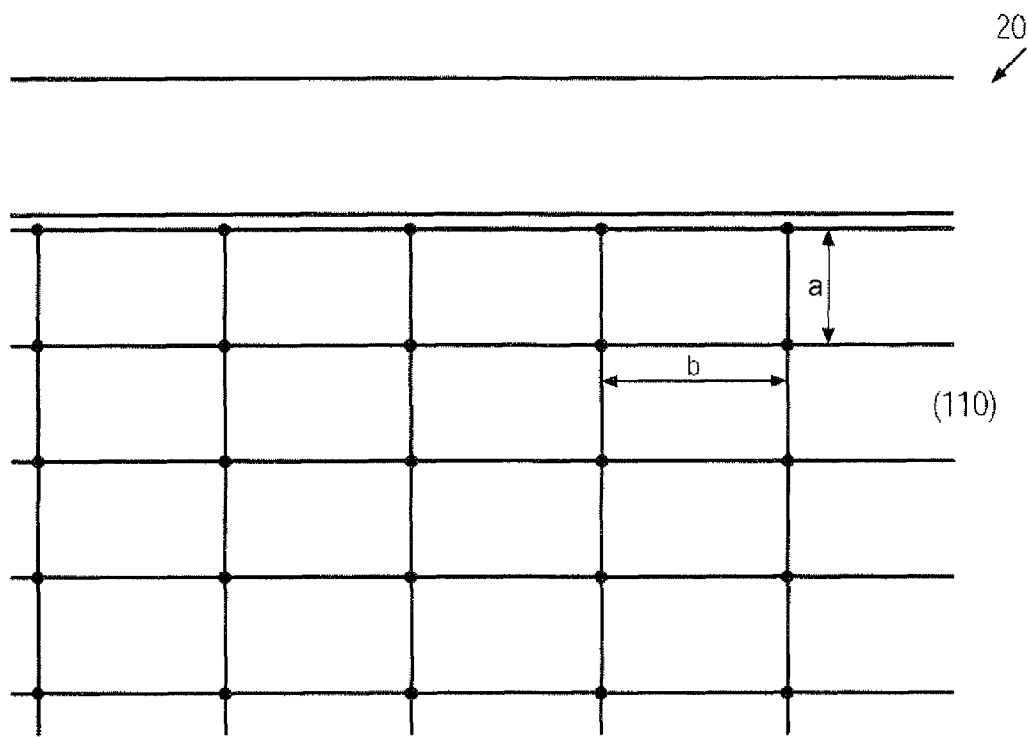
FIGS. 2b-2c schematically illustrate a cross-sectional view of a lattice structure, wherein different crystal planes in the vertical and horizontal re-crystallization direction may provide enhanced lattice defect.

FIG. 2b schematically illustrates the transistor 200N in a sectional view as indicated by the line IIb in FIG. 2a. As previously explained, since, in a cubic lattice structure, a respective direction is perpendicular to a plane defined by the same Miller indices, the corresponding crystalline plane seen in the sectional view of FIG. 2b represents a (110) plane. Hence, "a" represents the basic lattice constant of silicon and "b" is the diagonal dimension thereof (a×√2).

Figure 2C:
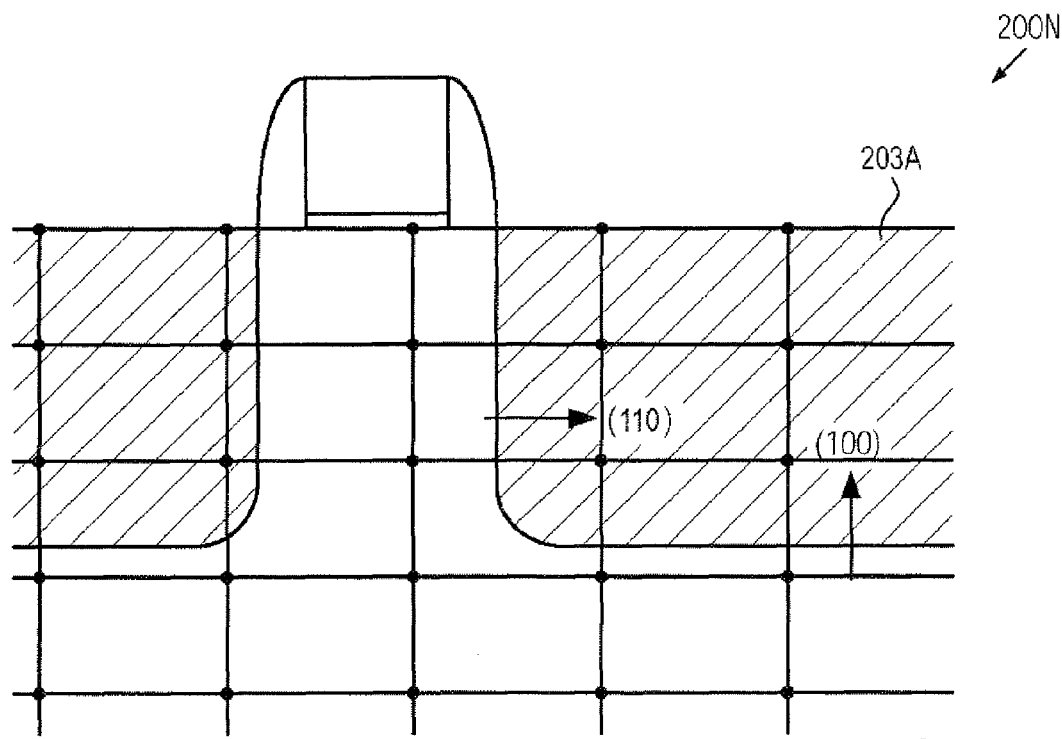

FIG. 2c schematically illustrates a sectional view as indicated by IIc in FIG. 2a, which also represents a (110) plane, since the transistor length direction is also oriented along the <110> direction. Thus, upon amorphizing a portion of the semiconductor layer 203, indicated as 203A, as is for instance described for the N-channel transistors 100N of the region 150L in the previously described embodiments, the corresponding lattice structure may be substantially completely destroyed. Thereafter, the portion 203A has to be re-grown on the basis of appropriate anneal techniques, wherein the respective growth fronts may start from the remaining crystalline portions. That is, a growth process may proceed in the horizontal direction, wherein the respective "template" plane may be substantially represented by a (110) plane, as previously explained, while a vertical re-growth direction may be substantially represented by a (100) plane, thereby resulting in significant dislocation defects at the interface portion of both growth fronts.

Hence, in some illustrative aspects, the crystallographic orientation of the semiconductor material in a memory region may be taken into consideration when placing the respective N-channel transistor elements therein in order to obtain a growth behavior producing significantly reduced dislocation defects compared to the configuration as may typically be used in the speed-critical regions, as previously explained.

Figure 2D:
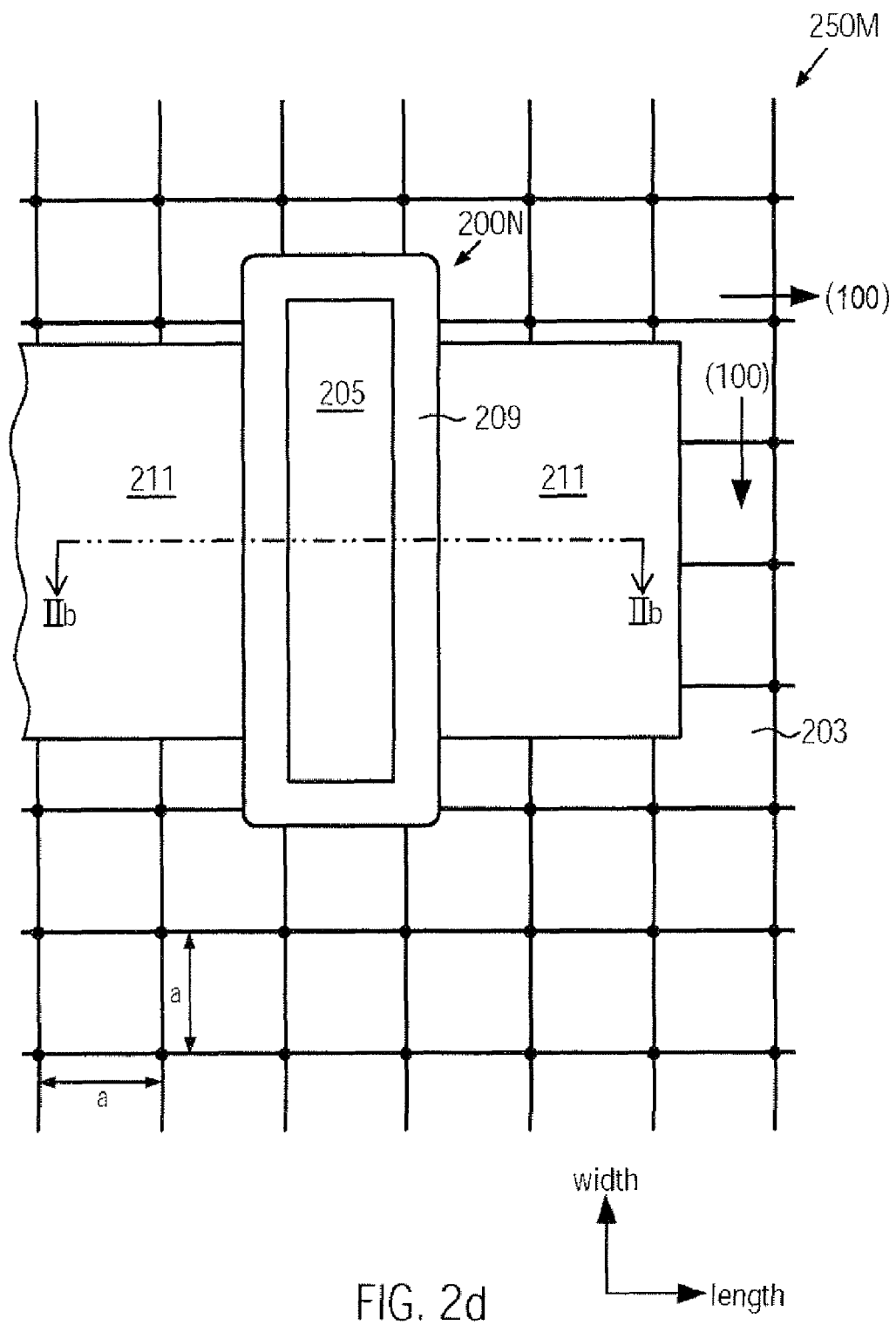
FIG. 2d schematically illustrates a top view of a transistor of a memory device area with matching growth surfaces in the vertical and horizontal direction, according to illustrative embodiments.

FIG. 2d schematically illustrates a top view of a portion of a semiconductor device representing a memory region 250M, which may comprise an N-channel transistor 200N including a gate electrode structure 205 in combination with a spacer structure 209 and drain and source regions 211, which may still require the incorporation of a significant amount of dopant species. In this illustrative embodiment, the semiconductor layer 203 may represent a silicon-based layer having a (100) surface orientation, wherein the length direction may be aligned along the <100> direction. That is, the transistor 200N of the memory region 250M may have a length direction that is rotated by 45 degrees with respect to the previously illustrated standard configuration, which may be accomplished by providing the substrate 201 so as to have incorporated therein portions of different crystallographic orientation.

Figure 2E:
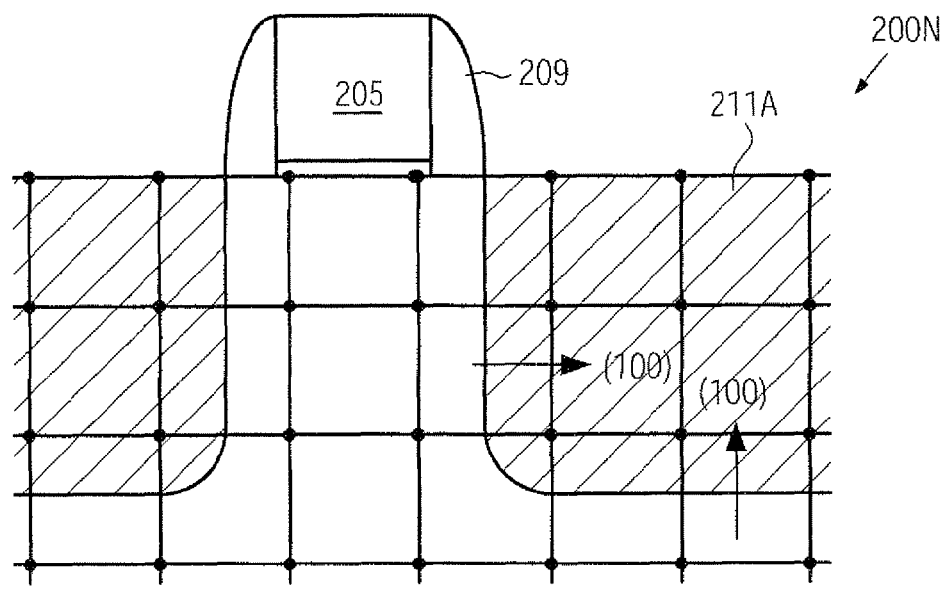
FIGS. 2e-2g schematically illustrate cross-sectional views and top views, respectively, of further transistor elements of the memory area in accordance with appropriately selected vertical and horizontal re-growth directions, according to still further illustrative embodiments.

FIG. 2e schematically illustrates a cross-sectional view of the transistor 200N in the memory region 250M, wherein an amorphized portion 211A is shown, which now has horizontal and vertical growth directions, which are specified by the same Miller indices, i.e., the respective template surfaces for the horizontal and vertical growth process are (100) surfaces, thereby reducing any respective dislocation defects.

Consequently, implantation processes may be applied in which a selectivity between N-channel transistors in speed-critical regions, such as the region 150L and the memory region 250M may not be required, since, upon re-crystallizing the corresponding amorphized portion, the portion 211A may be re-grown with a reduced defect rate, thereby providing enhanced operational stability in the memory region 250M while also enabling a moderately high strain level by, for instance, performing the re-growth on the basis of a rigid material, such as silicon nitride, as previously explained.

Figure 2F:
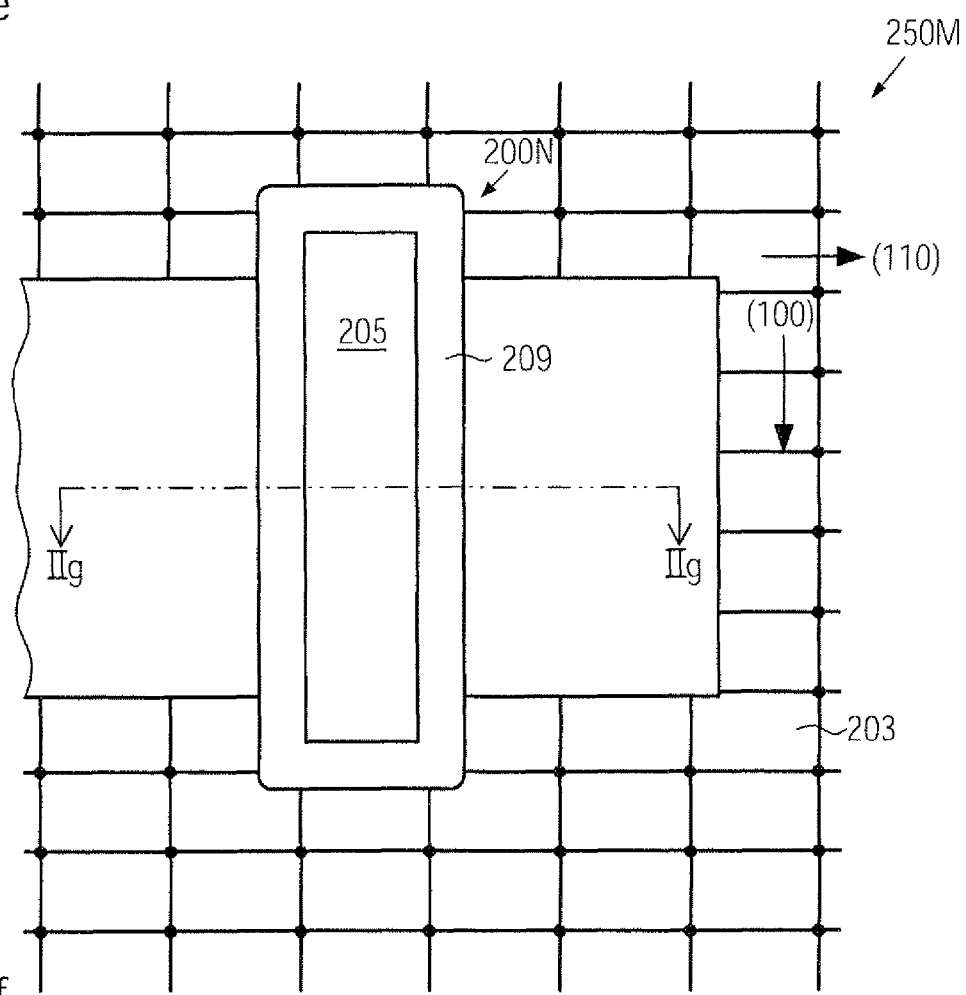

FIG. 2f schematically illustrates the N-channel transistor 200N in accordance with further illustrative embodiments, in which the semiconductor layer 203 may be provided so as to exhibit a (110) surface orientation so that, for a cubic lattice structure, such as silicon, a <100> direction and <110> direction may be present with an angle of 90 degrees, as indicated by the respective arrows in FIG. 2f. In the embodiment shown, the transistor 200N may be orientated with its length direction along the <110> direction so that, for a silicon-based semiconductor device, substantially the same physical conditions are provided for charge carrier flow behavior and the like as in the standard configuration. However, the width direction is aligned along the <100> direction.

Figure 2G:
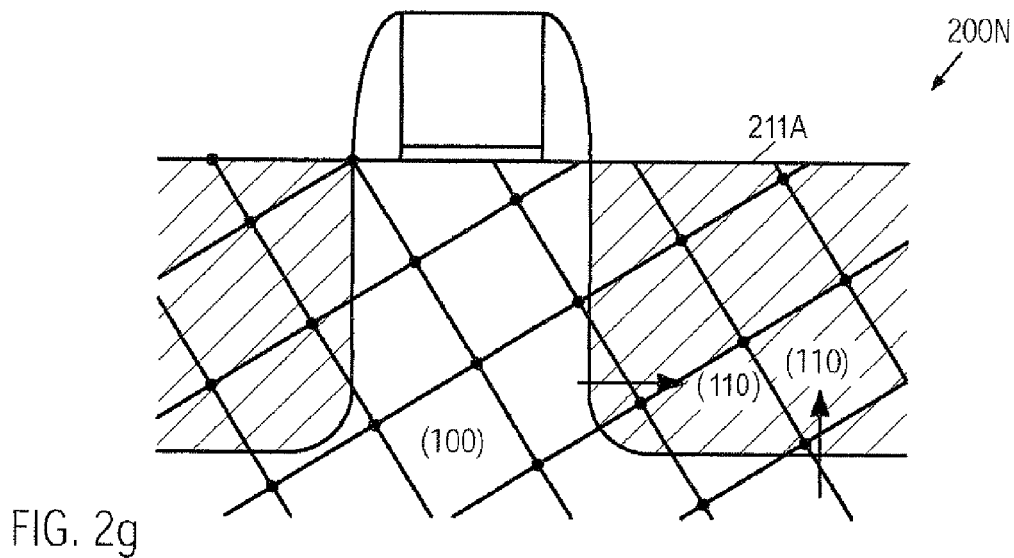

FIG. 2g schematically illustrates a cross-sectional view along the length direction, wherein a (100) plane is provided in the drawing plane of FIG. 2g, while the respective growth directions for the substantially amorphized portion 211A are based on respective <110> direction. Thus, as explained above, upon re-crystallizing the portion 211A, a significantly reduced number of stacking faults may be created, thereby providing substantially the same advantages as described above. It should be appreciated that the crystalline configuration as described with reference to FIGS. 2f and 2g may provide enhanced flexibility in designing appropriate semiconductor devices, since the two main crystallographic orientations are provided under 90 degrees angle offset, which may allow efficient circuit designs, i.e., different orientations of the transistor elements, while nevertheless providing a high spatial efficiency of the corresponding circuit design. For example, the N-channel transistors of the speed-critical device region may be orientated with an angle offset of 90 degrees with respect to the transistor 200N of the region 250M as shown in FIG. 2f. On the other hand, the transistor 200N in the region 250M may provide enhanced stability of the respective memory cells, as previously explained. Consequently, the transistors in the speed-critical device region may be rotated by 90 degrees with respect to the transistors in the memory region 250M, thereby enabling the usage of a common substrate material without significantly contributing to overall design complexity.

Figure 2H:
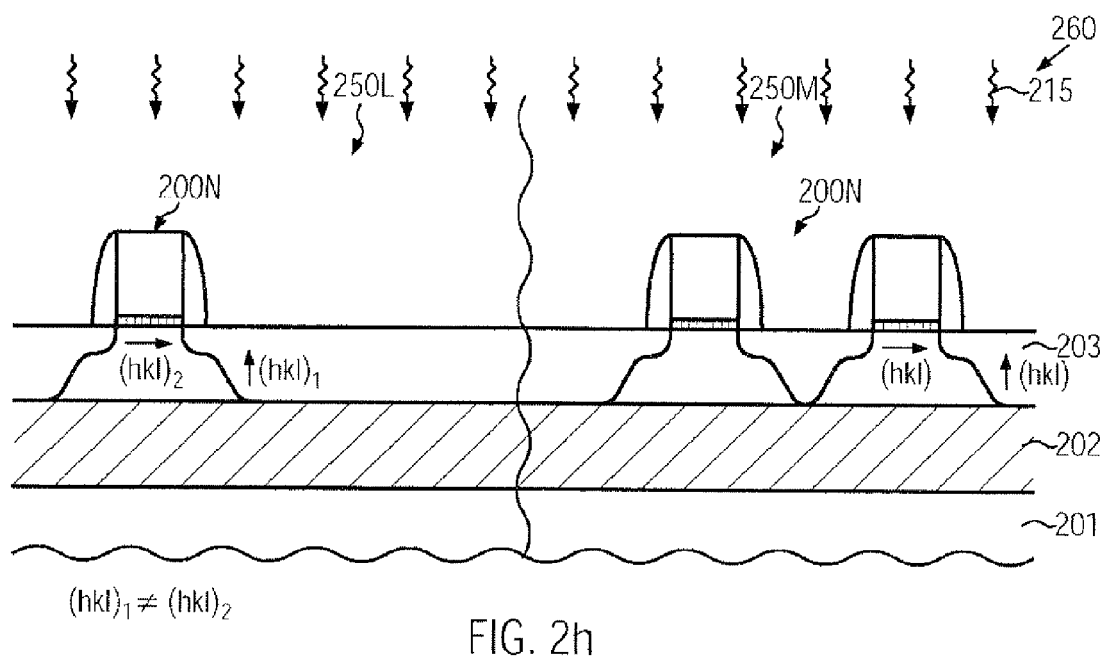
FIG. 2h schematically illustrates a cross-sectional view of the semiconductor device including the speed critical device region and the sensitive memory area, according to still further illustrative embodiments.

FIG. 2h schematically illustrates a cross-sectional view of a semiconductor device 260 comprising a substrate 201, a buried insulating layer 202 and the semiconductor layer 203, in which the growth directions during anneal process 215 may be different in transistors 200N of a device region 250L, while equivalent template planes may be provided for the transistors 200N in the memory area 250M. As indicated above, the semiconductor layer 203 may have appropriately selected different crystallographic orientations, as shown, so that the transistors in both regions 250L, 250M may be oriented in the same manner, or the transistors may be rotated with respect to each other. In any case, the Miller indices (hkl) for the vertical and horizontal direction are different in the region 250L, that is, $(hkl)_1$ differs from $(hkl)_2$, while, in the region 250M, equivalent sets of Miller indices may be provided.

As a result, the present disclosure provides techniques for maintaining a moderately high strain level in memory regions of complex semiconductor devices, while nevertheless enhancing operational stability of the respective memory cells, while at the same time enhanced performance of N-channel transistors in speed-critical device regions may be achieved. This may be accomplished by selectively performing an amorphization implantation in the speed-critical device region and/or by appropriately selectively modifying the conditions during the re-growth of amorphized portions in the memory region.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    selectively performing a pre-amorphization process for drain and source regions of a plurality of first N-channel transistors in a first device region using non-dopant ions, while masking a plurality of first P-channel transistors in said first device region and masking a plurality of second P-channel transistors and a plurality of second N-channel transistors formed in a memory device region of a semiconductor device;
    performing a second pre-amorphization process selectively for said second N-channel transistors, wherein said second pre-amorphization process comprises an implantation step using a tilt angle;
    annealing said first and second P-channel transistors and said second N-channel transistors in the presence of a rigid material layer formed above said first device region to re-crystallize said first N-channel transistors in a strained state; and
    providing a strain-inducing mechanism in said first device region and said memory device region to induce strain in said first and second P-channel transistors and second N-channel transistors.

2. The method of claim 1, wherein providing said strain-inducing mechanism comprises forming a stressed dielectric material above said first device region and said memory device region after annealing said first and second P-channel transistors and said second N-channel transistors.

3. The method of claim 1, wherein said rigid material layer is provided above said first device region and said memory device region.

4. The method of claim 1, further comprising forming said rigid material layer above said first device region and said memory device region and selectively removing said rigid material layer from above said memory device region prior to annealing said first and second P-channel transistors and N-channel transistors.

5. A method, comprising:
    performing a first amorphization process for a plurality of first N-channel transistors of a first device region of a semiconductor device using non-dopant ions;
    performing a second amorphization process for a plurality of second N-channel transistors of a memory device region using non-dopant ions, while masking said first device region, said second amorphization process comprising an implantation step using a tilt angle;
    annealing said first and second N-channel transistors; and
    forming a stressed dielectric material above said first and second N-channel transistors, said stressed dielectric material inducing a tensile strain in a channel region of said first and second N-channel transistors.

6. The method of claim 5, wherein said first amorphization process is performed for said first and second N-channel transistors in a common process.

7. The method of claim 5, wherein performing said first and second amorphization processes comprises masking P-channel transistors in said first device region and said memory device region.

8. The method of claim 5, wherein performing said first amorphization process comprises masking said memory device region prior to introducing an amorphizing species into said first N-channel transistors.

9. The method of claim 5, further comprising forming a rigid material layer above said first device region and said memory device region and annealing said first and second N-channel transistors in the presence of said rigid material layer.

10. The method of claim 9, further comprising at least partially removing said rigid material layer from said first device region and said memory device region prior to forming said stressed dielectric material.

11. The method of claim 5, wherein said second device region represents a static RAM area of a CPU.

12. The method of claim 11, wherein said first device region represents a logic block.

13. The method of claim 5, wherein said first N-channel transistors have an SOI configuration.

14. A method, comprising:
    forming a plurality of first N-channel transistors in a first device region above a first initially crystalline semiconductor layer, said first N-channel transistors defining a first length direction, said first length direction being oriented along a predefined crystalline direction defined by a first set of Miller indices, said predefined crystalline direction being substantially equivalent to a surface orientation of said first crystalline semiconductor layer that is defined by a set of Miller indices that differs from said first set;

forming a plurality of second N-channel transistors in a memory device region above a second initially crystalline semiconductor layer, said second N-channel transistors defining a second length direction, said second length direction being oriented along a predefined crystalline direction defined by a second set of Miller indices, said predefined crystalline direction being substantially equivalent to a surface orientation of said second crystalline semiconductor layer that is defined by the second set of Miller indices;

performing an amorphization implantation process for forming a substantially amorphized portion in drain and source areas of at least said first N-channel transistors; and re-crystallizing said substantially amorphized portion of said first N-channel transistors.

15. The method of claim 14, wherein performing said amorphization implantation process includes forming substantially amorphized portions in drain and source areas of said second N-channel transistors.

16. The method of claim 14, further comprising forming a rigid material layer above said first device region and said memory device region and re-crystallizing said portions in the presence of said rigid material layer.

17. The method of claim 16, further comprising at least partially removing said rigid material layer.

18. The method of claim 14, wherein said first length direction differs from said second length direction.

19. The method of claim 14, wherein said first length direction is collinear to said second length direction and said first and second crystalline semiconductor layers have different crystallographic orientations.

* * * * *